(12) United States Patent
Tsuruzoe et al.

(10) Patent No.: US 7,997,956 B2
(45) Date of Patent: Aug. 16, 2011

(54) QUARTZ GLASS TOOL FOR HEAT TREATMENT OF SILICON WAFER AND PROCESS FOR PRODUCING THE SAME

(75) Inventors: Junichi Tsuruzoe, Tokyo (JP); Shinichi Okoshi, Kumamoto (JP); Kunihiro Yamasaki, Kumamoto (JP)

(73) Assignee: Shin-Etsu Quartz Products Co., Ltd., Tokyo (JP)

( * ) Notice: Subject to any disclaimer, the term of this patent is extended or adjusted under 35 U.S.C. 154(b) by 675 days.

(21) Appl. No.: 11/921,969

(22) PCT Filed: Jun. 1, 2006

(86) PCT No.: PCT/JP2006/310973
§ 371 (c)(1),
(2), (4) Date: Jan. 29, 2008

(87) PCT Pub. No.: WO2006/134779
PCT Pub. Date: Dec. 21, 2006

(65) Prior Publication Data
US 2008/0149575 A1 Jun. 26, 2008

(30) Foreign Application Priority Data
Jun. 16, 2005 (JP) ................................. 2005-176685

(51) Int. Cl.
*B28D 5/00* (2006.01)
*B24B 1/00* (2006.01)
(52) U.S. Cl. .......................................... 451/41; 451/58
(58) Field of Classification Search .................... 451/57, 451/58, 41, 53
See application file for complete search history.

(56) References Cited

FOREIGN PATENT DOCUMENTS

| JP | 56-145123 | 11/1981 |
|---|---|---|
| JP | 11-349338 | 12/1999 |
| JP | 2000-127020 | 5/2000 |
| JP | 2004/051724 | 6/2004 |
| WO | WO-2004/051724 | 6/2004 |

*Primary Examiner* — Robert Rose
(74) *Attorney, Agent, or Firm* — Jordan and Hamburg LLP

(57) ABSTRACT

To provide a quartz glass tool, for silicon wafer heat treatment, having a transparent grooving face, which is free from the deposition of particles of a transition metal element foreign material derived from glass dust or diamond blade produced by breakdown of acute irregularities based on opening of very small concaves and convexes and microcracks, causes no significant change in dimension also in cleaning with hydrofluoric acid, and can maintain a high degree of cleanness even after use of a long period of time, and to provide a process for producing the same. A quartz glass tool for silicon wafer heat treatment, comprising a wafer mounting member having a grooving face formed by machining, characterized in that the whole grooving face of the wafer mounting member is transparent, the surface roughness is 0.03 to 0.3 μm in terms of center line average roughness (Ra) and 0.2 to 3.0 μm in terms of maximum roughness (Rmax), and a change in center line average roughness and maximum roughness after etching with a 5% aqueous hydrogen fluoride solution for 24 hr is not more than 50%. A process for producing a quartz glass tool for silicon wafer heat treatment, comprising roughly machining a wafer mounting member with a diamond blade having a rough particle size, conducting remachining with a diamond blade having a finer particle size than the above diamond blade, and then subjecting the inside of the groove to firing finishing.

7 Claims, 5 Drawing Sheets

QUARTZ GLASS TOOL FOR HEAT TREATMENT OF SILICON WAFER AND PROCESS FOR PRODUCING THE SAME

TECHNICAL FIELD

The present invention relates to a tool for silicon wafer heat treatment having a transparent grooved surface and a process for producing the tool. More particularly, the present invention relates to a quartz glass tool for silicon wafer heat treatment having, as a grooved surface of a wafer mount member provided in the quartz glass tool, a transparent grooved surface with a reduced amount of materials such as particles with which a silicon wafer is contaminated, and to a process for producing the tool.

BACKGROUND ART

Quartz glass tools having comparatively high heat resistance and high purity have been used for transporting silicon wafers and holding silicon wafers in heating furnaces. An example of such quartz glass tools is a tool for use in a vertical furnace, such as shown in FIG. 1, in which (four) wafer mount members 2 having grooved portions 3 are welded to a top plate 4 and to a base plate 5. It is necessary to form grooves in the wafer mount members with a constant pitch with high accuracy. Grooving is ordinary performed with a diamond blade. With working on quartz glass with a diamond blade, however, there is a problem that since quartz glass is a brittle material, minute concaves and convexes and microcracks are generated in the worked surface to cause damage to a silicon wafer, or various transition metal element foreign matters derived from a bonding material on the diamond blade are attached to and remain on or in the minute concaves and convexes and microcracks and are molten and diffused at the time of a heat treatment on a silicon wafer to contaminate the silicon wafer. Cleaning by lightly etching with a fluoric acid solution after cutting with a diamond blade has therefore been practiced, with the result that the grooved surface is not completely cleaned; various transition metal element foreign matters remain to cause contaminations on silicon wafers. With further etching with a fluoric acid, a problem has arisen that minute concaves and convexes based on opening of microcracks in the grooved surface are made acute such as to damage a silicon wafer.

In particular, in recent years, the degree of integration of semiconductor devices has been increased and devices such as flush memories seriously badly influenced by impurities have been developed, so that the desired purity with respect to silicon wafers cannot be ensured as long as the above-described quartz glass tool is used. Therefore a method of finishing by heat-treating a surface of a groove with a burner at an angle of 5 to 45 degrees from above the grooves (patent document 1), a method of polishing a groove surface with a polishing brush (patent document 2) and the like have been proposed. With the method in patent document 1, however, remaining of the trace of a grindstone in the grooved surface and attachment of particles of a foreign matter, glass dust or the like to the trace of the grindstone, or a change in size of the grooved portion, i.e., a groove sag, or the like have occurred. Also, with the method in patent document 2, there has been a problem such as a silicon wafer contamination problem due to remaining of the trace of a grindstone and attachment of particles of a foreign matter, glass dust or the like to the trace of the grindstone.

Patent document 1: Japanese Patent Laid-Open No. 11-349338
Patent document 2: Japanese Patent Laid-Open No. 2000

DISCLOSURE OF THE INVENTION

The inventors of the present invention have earnestly made studies under such circumstances and found that a quartz glass tool free from attachment of particles, e.g., particles of glass dust due to collapse of acute irregularities based on minute concaves and convexes or opening of microcracks or particles of various transition metal element foreign matters generated from a diamond blade or the like, capable of maintaining a high degree of cleanness during use for a long time, having finer concaves and convexes in a grooved surface of a wafer mount member ground with a diamond blade and having a reduced change in size even during cleaning with fluoric acid can be obtained by making the grooved surface transparent, setting the surface roughness of the entire grooved surface to 0.03 to 0.3 μm in center-line average roughness (Ra) and 0.2 to 3.0 μm in maximum roughness (Rmax) and by setting the rates of change in the center line average roughness (Ra) and the maximum roughness (Rmax) after etching with a 5% hydrogen fluoride aqueous solution for 24 hours to 50% or less. The inventors also found that the above-described quartz glass tool can be easily produced by grinding the portion to be grooved of the wafer mount member of the quartz glass tool with a diamond blade of a coarse particle size, again grinding the grooved portion with a diamond blade of a small particle size, and making the ground portion transparent by fire finishing with oxyhydrogen gas flame.

That is, an object of the present invention is to provide a quartz glass tool for silicon wafer heat treatment having a transparent grooved surface, free from attachment of particles of glass dust due to collapse of acute irregularities based on minute concaves and convexes or opening of microcracks or particles of a transition metal element foreign matter due to a diamond blade or the like, having a reduced change in size even during cleaning with fluoric acid and capable of maintaining a high degree of cleanness during use for a long time.

Another object of the present invention is to provide a process for producing the above-described quartz glass tool.

The present invention in achieving the above-described object relates to a quartz glass tool for silicon wafer heat treatment provided with a wafer mount member having a grooved surface formed by grinding, characterized in that the entire grooved surface of the wafer mount member is transparent; the surface roughness of the grooved surface is 0.03 to 0.3 μm in center-line average roughness (Ra) and 0.2 to 3.0 μm in maximum roughness (Rmax); and the rates of change in the center line average roughness (Ra) and the maximum roughness (Rmax) after etching with a 5% hydrogen fluoride aqueous solution for 24 hours are 50% or less, and to a process for producing the quartz glass tool.

The wafer mount member provided in the quartz glass tool for silicon wafer heat treatment according to the present invention is a member which has a transparent grooved surface, which is grooved by grinding, in which the surface roughness of the grooved surface is 0.03 to 0.3 μm in center-line average roughness (Ra) and 0.2 to 3.0 μm in maximum roughness (Rmax) and the rates of change in the center line average roughness (Ra) and the maximum roughness (Rmax) after etching with a 5% hydrogen fluoride aqueous solution for 24 hours are 50% or less. Because of having this grooved surface, the quartz glass tool for silicon wafer heat treatment is free from attachment of particles of glass dust due to collapse of acute irregularities based on minute concaves and convexes or opening of microcracks or particles of a transition metal element foreign matter due to a diamond blade or the like. Further, the concaves and convexes in the grooved surface are fine and the quartz glass tool has a reduced change in size even during cleaning with fluoric acid and can be used for a long time. It is not practical in terms of productivity and cost to perform grinding so that the center-line average roughness is lower than 0.03 μm. If the center-line average roughness exceeds 0.3 μm, minute concaves and convexes or microcracks remain in the ground surface even after fire finishing to cause damage to a silicon wafer or generate particles with which a silicon wafer is contaminated. If the rates of change in the center line average roughness (Ra) and the maximum roughness (Rmax) after etching with a 5% hydrogen fluoride aqueous solution for 24 hours exceed 50%, the concaves and convexes in the grooved surface are changed by cleaning with fluidic acid to make long-time stable use impossible. The rates of change in the center line average roughness (Ra) and the maximum roughness (Rmax) are the ratios of the changes in the center line average roughness (Ra) and the maximum roughness (Rmax) to the original values of the center line average roughness (Ra) and the maximum roughness (Rmax) at each of time periods from 0 to 24 hours during which the wafer mount member is immersed in the 5% hydrogen fluoride aqueous solution.

As shown in FIGS. 2 and 3, the above-described wafer mount member is produced by roughly grinding a quartz glass raw workpiece in the form of a cylinder or a prism cylindrical or prism form with a diamond blade of a coarse particle size or a particle size of #250 to 350, with a groove width (d) of 3 to 5 mm, a pitch (p) of 3 to 6 mm and a groove depth of 4.5 to 10 mm, again grinding the workpiece with a diamond blade of a small particle size or a particle size of #600 to 2000, with a machining allowance of 0.06 to 0.1 mm, cleaning the workpiece with fluoric acid after grinding, and fire-finishing the grooved surface with oxyhydrogen gas flame obtained from hydrogen gas and oxygen gas so that the grooved surface becomes transparent. This wafer mount member is incorporated in the assembly of the quartz glass tool by being welded to a top plate and to a base, and undergoes annealing and fluoric acid cleaning.

The diamond blade used in the above-described rough grinding is, for example, a metal-bond-type diamond blade, a resin-bond-type diamond blade or a vitrified-bond-type diamond blade. As the diamond blade used in regrinding, the above-mentioned diamond blade having a fine particle size of #600 to 2000 is used. More preferably, a diamond blade obtained by pulverizing metal-bonded diamond and sintering the pulverized diamond with a resin bond.

The quartz glass tool for silicon wafer heat treatment according to the present invention is free from attachment of particles of glass dust due to collapse of acute irregularities based on minute concaves and convexes or opening of microcracks or particles of a transition metal element foreign matter due to a diamond blade or the like, has a reduced change in size even during cleaning with fluoric acid and can be used for a long time. This quartz glass tool can be easily produced by performing grinding with a diamond blade of a coarse particle size, again performing grinding with a diamond blade of a small particle size, and performing fire finishing on the grooved surface.

THE BEST MODE FOR CARRYING OUT THE INVENTION

The present invention will be described in detail with respect to concrete examples thereof. The present invention, however, is not limited to the examples.

The surface roughness in the examples and the like described below is the value measured with a surface roughness tester (HANDY SURF E-35A from ACCRETECH (Tokyo Seimitsu Co., Ltd.)). Values for particles were measured by a "method of counting particles increased in pure water with an in-liquid particle counter".

Example 1

Figure 1:
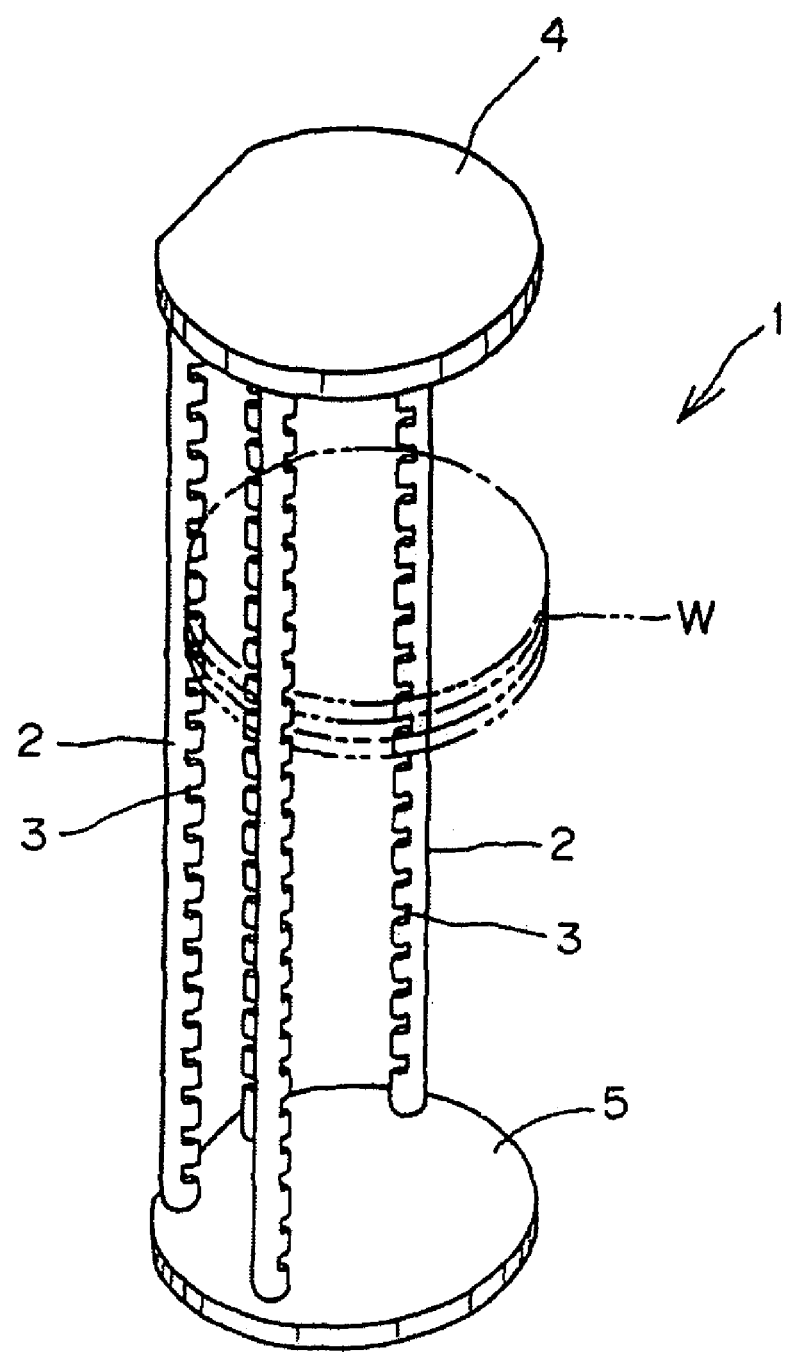
FIG. 1 is a perspective view of a quartz glass tool for use in a vertical furnace.
Figure 2:
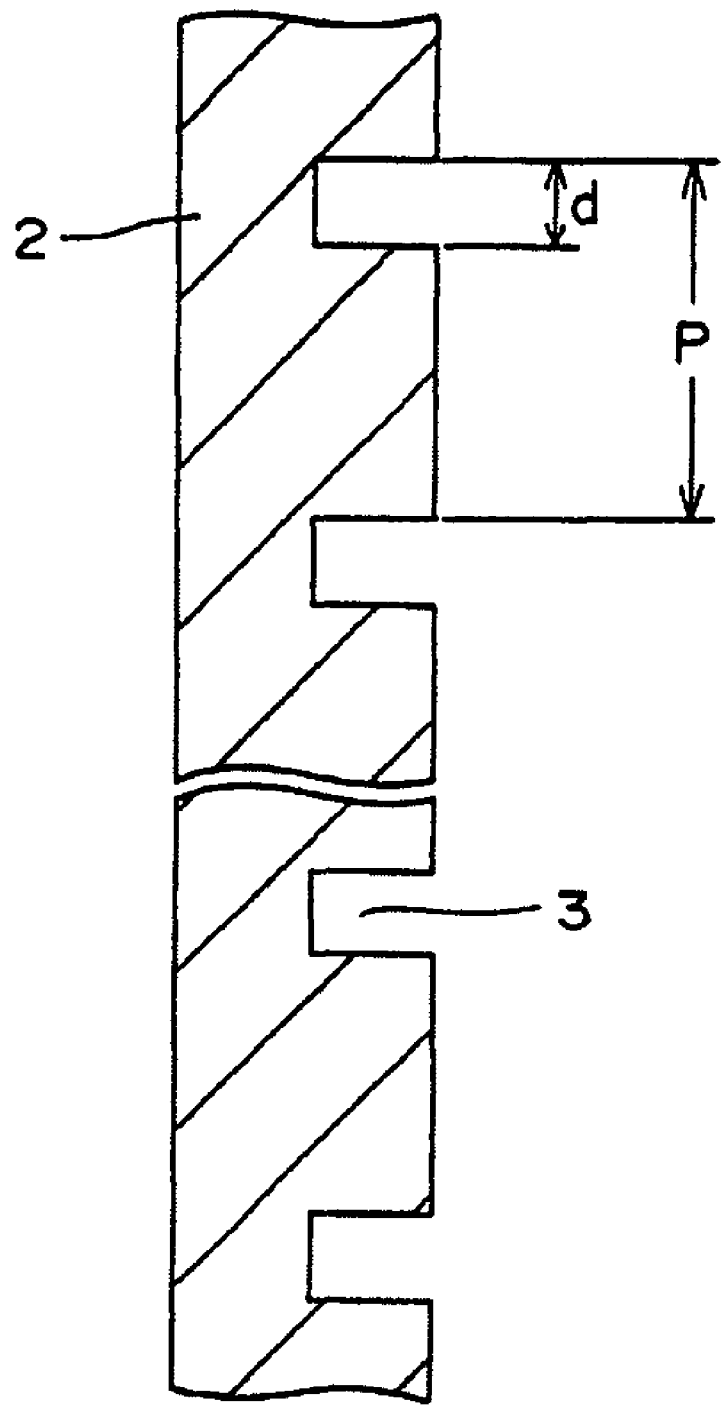
FIG. 2 is an enlarged view of a wafer mount member.
Figure 3:
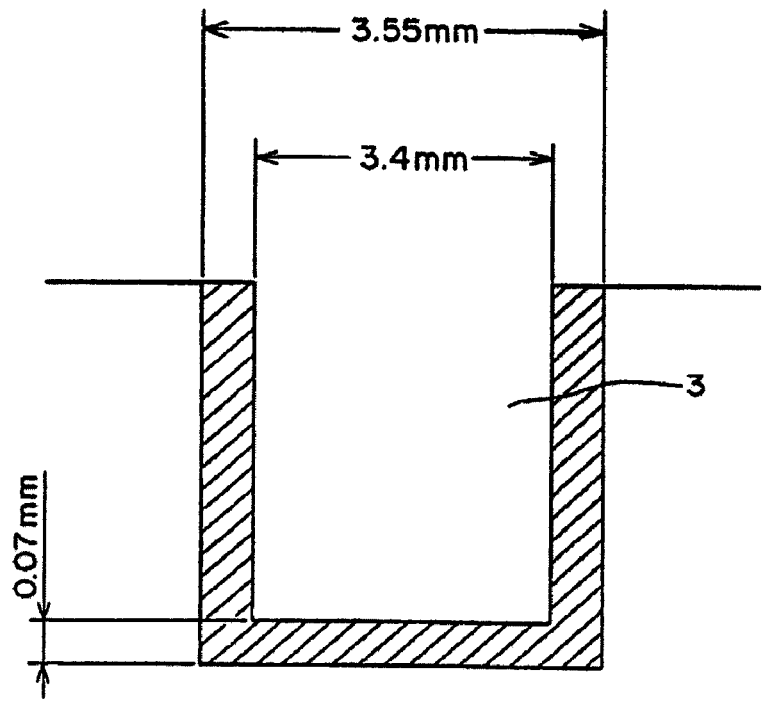
FIG. 3 is a diagram for explaining the formation of a wafer mount groove.
Figure 4:
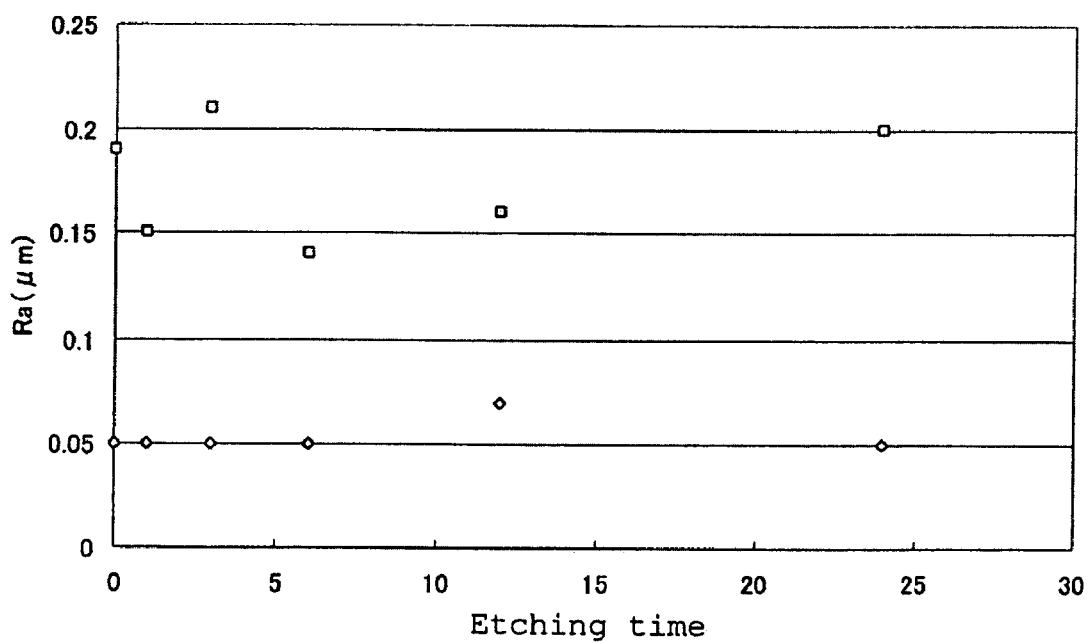
FIG. 4 is a graph showing the rate of change in Ra of the groove bottom surface of the wafer mount member during immersion in fluoric acid solution for a long time.
Figure 5:
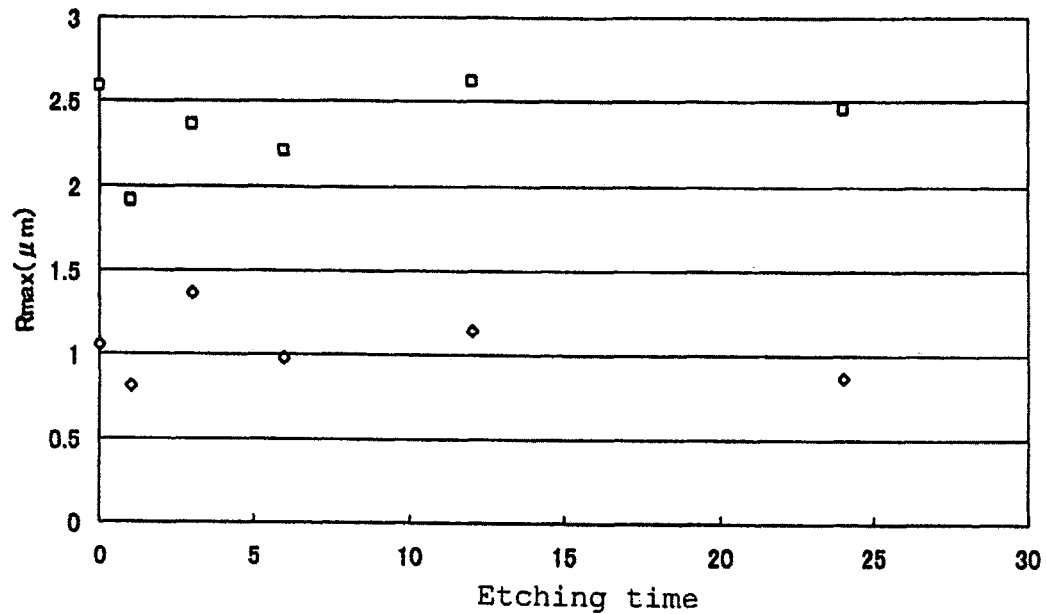
FIG. 5 is a graph showing the rate of change in Rmax of the groove bottom surface of the wafer mount member during immersion in fluoric acid solution for a long time.
Figure 6:
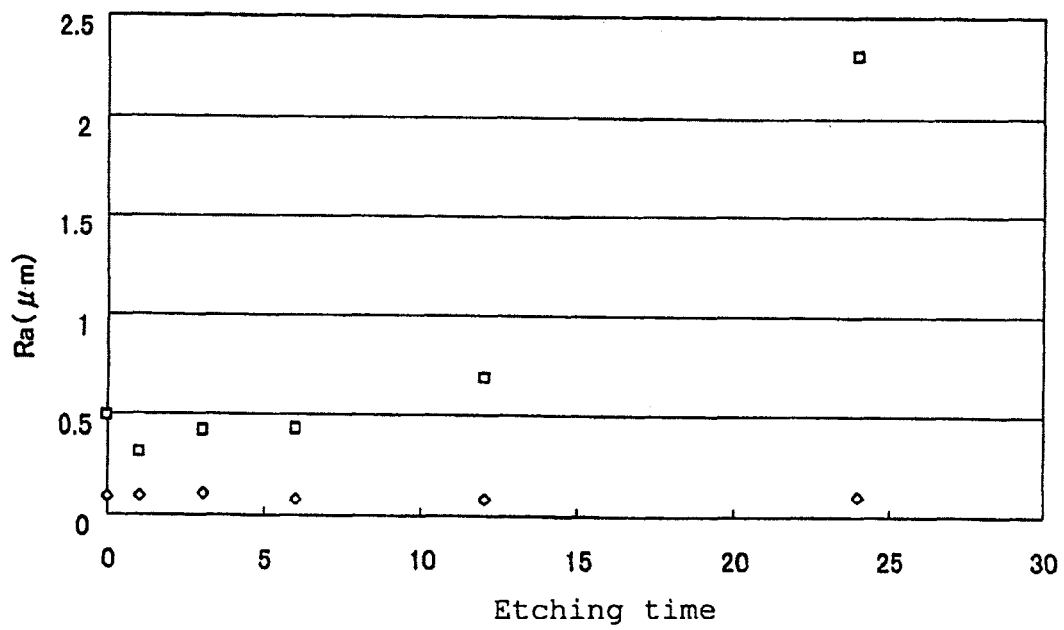
FIG. 6 is a graph showing the rate of change in Ra of the groove wall surface of the wafer mount member during immersion in fluoric acid solution for a long time.
Figure 7:
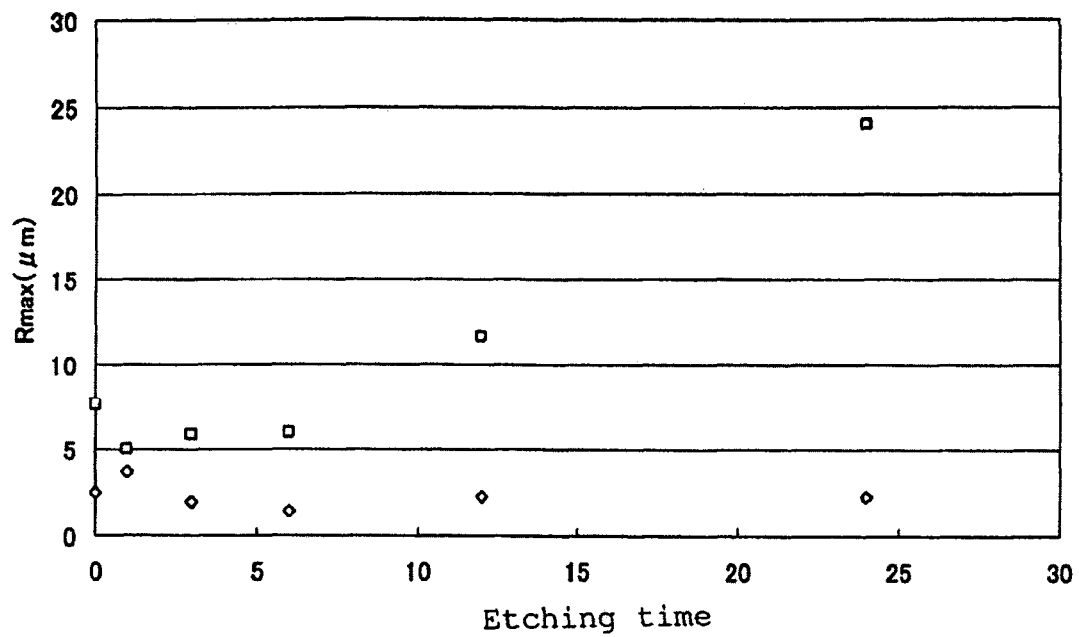
FIG. 7 is a graph showing the rate of change in Rmax of the groove wall surface of the wafer mount member during immersion in fluoric acid solution for a long time.

A solid rod having a diameter of 12 mm was ground by using a #325 diamond blade at a peripheral velocity of 800 m/min. and at a feed rate of 100 mm/min. with a groove depth of 6 mm, a groove width of 3.4 mm and a groove pitch of 3.5 mm. The grooved rod obtained was again ground by using a #1000 diamond blade with a side surface machining allowance of 0.075 mm and a bottom surface machining allowance of 0.07 mm, as shown in FIG. 3, and fire-finished with a gas burner to be made transparent. Four wafer mount members with grooves having a groove width of 3.55 mm and a pitch width of 3.6 mm were made in this way. The wafer mount members were cleaned with 5% fluoric acid aqueous solution for 10 minutes and thereafter assembled in a wafer port 1 shown in FIG. 1 by being welded to a quartz glass top plate 4 and a base plate 5. Table 1 shows the surface roughness of the grooved surface of the wafer mount member. The center-line average roughness (Ra) and the center-line maximum roughness (Rmax) of the groove bottom surface in Table 1 were values measured at arbitrary three points on the bottom surface of the grooved portion of the wafer mount member. Ra and Rmax of the groove wall surfaces are values measured with respect to an end portion, a central portion and a bottom portion of the grooved side wall surfaces of the wafer mount member. As is apparent from Table 1, the grooved surface of the wafer mount member according to the present invention had a low surface roughness and was transparent, and substantially no generation of particles such as glass dust due to collapse of minute concaves and convexes or microcracks was observed. Further, particles were measured when the wafer mount member was set standing in pure water for 5 minutes (hereinafter referred to as standing processing) and when ultrasonic waves were applied during the immersion in pure water for 5 minutes (hereinafter referred to as application processing). As shown in Table 2, the amount of generation of particles when application processing was performed was smaller. Further, the grooved surface was observed with the eye to find that the grooved surface was as transparent as the surrounding quartz glass portion without whitishness due to a grinding trace.

Example 2

A grooved wafer mount member with grooves having a groove width of 3.55 mm and a pitch width of 3.6 mm was made by grinding a solid rod having a diameter of 12 mm with a #325 diamond blade at a peripheral velocity of 800 m/min. and at a feed rate of 100 mm/min., with a groove depth of 6 mm, a groove width of 3.4 mm and a groove pitch of 3.5 mm, again grounding the rod with a #1000 diamond blade, with a side surface machining allowance of 0.075 mm and a bottom surface machining allowance of 0.07 mm, and making the grooves transparent by fire finishing with a gas burner, as was that in Example 1. To check size stability of the wafer mount member with grooves under fluoric acid cleaning, the groove bottom and groove wall surfaces were examined for Ra and Rmax when the wafer mount member was immersed in 5% fluoric acid cleaning solution for 1 to 24 hours. Table 3 shows the results of this examination, which are also indicated by symbol ◇ in FIGS. 4 to 7. Table 3 shows average values with respect to three points on the groove bottom and groove wall surfaces measured in the same manner as those in Example 1. FIGS. 4 to 7 are graphs in which the corresponding values are plotted. As is apparent from Table 3 and FIGS. 4 to 7, even in the case of immersion in fluoric acid solution for 24 hours, the wafer mount member with grooves according to the present invention had low Ra and Rmax change rates: Ra change rate of about 10% and Rmax change rate of about 12%, and enabled performing heat treatment on silicon wafers with stability.

Comparative Example 1

A quartz glass solid rod was ground as in Example 1 by using a #325 diamond blade at a peripheral velocity of 800 m/min. and at a feed rate of 100 mm/min. with a groove depth of 6 mm, a groove width of 3.4 mm and a groove pitch of 3.5 mm, cleaned with fluoric acid and had the grooved surface made transparent by using a gas burner, as was that in Example 1. Table 1 shows Ra and Rmax of the grooved surface of the obtained wafer mount member. Also, Table 2 shows values as a result of measurement of particles. The amount of particles attached was large in each of standing processing and application processing, as shown in Table 2. Further, the grooved surface was observed with the eye. A whitish grindstone trace was thereby observed. This wafer mount member was immersed in 5% fluoric acid cleaning solution for a long time: 1 to 24 hours, as was that in Example 2, thereby examining the groove bottom and groove wall surfaces for Ra and Rmax during immersion in the solution. Table 3 shows the results of this examination, which are also indicated by symbol □ in FIGS. 4 to 7. As is apparent from Table 3 and FIGS. 4 to 7, Ra and Rmax of the wafer mount member were largely changed during immersion in the fluoric acid cleaning solution for a long time. The change rate exceeded 50% and hindrance to heat treatment on silicon wafers was caused.

TABLE 1

| Processing | | Position | | Example 1 Ra (μm) | Example 1 Rmax (μm) | Comparative Example 1 Ra (μm) | Comparative Example 1 Rmax (μm) |
|---|---|---|---|---|---|---|---|
| Diamond grinding | Grinding with #325 grindstone | Groove bottom surface | 1 | 0.26 | 2.12 | 0.26 | 2.12 |
| | | | 2 | 0.18 | 1.70 | 0.18 | 1.70 |
| | | | 3 | 0.30 | 2.42 | 0.30 | 2.42 |
| | | | Average | 0.25 | 2.08 | 0.26 | 2.08 |
| | | Groove wall surface | End portion | 0.32 | 3.36 | 0.32 | 3.38 |
| | | | Central portion | 0.30 | 3.54 | 0.30 | 3.54 |
| | | | Bottom portion | 0.32 | 3.86 | 0.32 | 3.86 |
| | | | Average | 0.31 | 3.59 | 0.31 | 3.59 |
| | Grinding with #1000 grindstone after grinding shown above | Groove bottom surface | 1 | 0.16 | 1.18 | | |
| | | | 2 | 0.12 | 1.06 | | |
| | | | 3 | 0.12 | 1.26 | | |
| | | | Average | 0.13 | 1.17 | | |
| | | Groove wall surface | End portion | 0.12 | 1.04 | | |
| | | | Central portion | 0.10 | 0.80 | | |
| | | | Bottom portion | 0.14 | 1.12 | | |
| | | | Average | 0.12 | 0.99 | | |
| Fire finishing | | Groove bottom surface | 1 | 0.04 | 0.22 | 0.14 | 1.48 |
| | | | 2 | 0.04 | 0.94 | 0.18 | 1.70 |
| | | | 3 | 0.08 | 1.24 | 0.14 | 0.90 |
| | | | Average | 0.05 | 0.80 | 0.15 | 1.36 |
| | | Groove wall surface | End portion | 0.06 | 0.34 | 0.46 | 3.88 |
| | | | Central portion | 0.06 | 0.46 | 0.40 | 2.98 |
| | | | Bottom portion | 0.10 | 1.00 | 0.38 | 3.70 |
| | | | Average | 0.07 | 0.60 | 0.41 | 3.52 |
| 5% HF processing | | Groove bottom surface | 1 | 0.04 | 0.20 | 0.10 | 1.46 |
| | | | 2 | 0.04 | 0.36 | 0.26 | 2.76 |
| | | | 3 | 0.06 | 0.96 | 0.18 | 1.44 |
| | | | Average | 0.05 | 0.51 | 0.18 | 1.89 |
| | | Groove wall surface | End portion | 0.06 | 0.56 | 0.24 | 2.32 |
| | | | Central portion | 0.08 | 0.66 | 0.22 | 2.10 |
| | | | Bottom portion | 0.12 | 0.80 | 0.20 | 1.54 |
| | | | Average | 0.09 | 0.67 | 0.22 | 1.99 |

In table 1 above, Ra and Rmax in diamond grinding are values 8 minutes after 5% fluoric acid processing, and Ra and Rmax in fire finishing are values 10 minutes after 5% fluoric acid processing.

TABLE 2

| | | Particle size | | | | |
|---|---|---|---|---|---|---|
| | | ≧0.2 μm | ≧0.3 μm | ≧0.5 μm | ≧1.0 μm | ≧2.0 μm |
| Standing processing | Example 1 | $1.1 \times 10^3$ | $5.1 \times 10^2$ | $8.7 \times 10$ | $2.0 \times 10$ | 0 |
| | Comparative Example 1 | $2.1 \times 10^4$ | $7.8 \times 10^3$ | $1.3 \times 10^3$ | $2.7 \times 10^2$ | $5.3 \times 10$ |
| Application processing | Example 1 | $6.2 \times 10^5$ | $2.0 \times 10^5$ | $3.2 \times 10^4$ | $5.3 \times 10^3$ | $1.3 \times 10^3$ |
| | Comparative Example 1 | $2.2 \times 10^7$ | $1.1 \times 10^7$ | $2.3 \times 10^5$ | $4.0 \times 10^5$ | $8.7 \times 10^4$ |

TABLE 3

| | | Example 2 | | Comparative Example 1 | |
|---|---|---|---|---|---|
| Processing time (h) | Position | Ra (μm) | Rmax (μm) | Ra (μm) | Rmax (μm) |
| 0 | Groove bottom surface | 0.05 | 1.05 | 0.49 | 2.59 |
| | Groove side surface | 0.09 | 2.51 | 0.19 | 7.59 |
| 1 | Groove bottom surface | 0.05 | 0.81 | 0.15 | 1.91 |
| | Groove side surface | 0.15 | 3.68 | 0.31 | 5.00 |
| 3 | Groove bottom surface | 0.05 | 1.99 | 0.21 | 2.36 |
| | Groove side surface | 0.11 | 1.37 | 0.42 | 5.87 |
| 6 | Groove bottom surface | 0.08 | 0.98 | 0.14 | 2.21 |
| | Groove side surface | 0.05 | 1.39 | 0.43 | 5.97 |
| 12 | Groove bottom surface | 0.07 | 1.14 | 0.16 | 2.62 |
| | Groove side surface | 0.08 | 2.31 | 0.69 | 11.60 |
| 24 | Groove bottom surface | 0.05 | 0.87 | 0.20 | 2.46 |
| | Groove side surface | 0.10 | 2.25 | 2.30 | 24.06 |

INDUSTRIAL APPLICABILITY

The quartz glass tool for silicon wafer heat treatment according to the present invention is capable of maintaining a high degree of cleanness over a long term without contaminating silicon wafers with particles, and is useful in heat treatment on a highly integrated semiconductor device, particularly in a diffusion step.

The invention claimed is:

1. A process for producing a quartz glass tool for silicon wafer heat treatment, comprising:
   roughly grinding a wafer mount member with a coarse diamond blade having a particle size of #250 to 350;
   regrinding the wafer mount member with a fine diamond blade having a particle size of #600 to 2000, a machine allowance in said regrinding being from 0.06 to 0.1 mm; and
   fire finishing a grooved surface after said regrinding so that the grooved surface becomes transparent.

2. The process for producing a quartz glass tool for silicon wafer heat treatment according to claim 1, wherein, after said etching, a surface roughness of the grooved surface is 0.03 to 0.3 μm in center-line average roughness (Ra) and 0.2 to 3.0 μm in maximum roughness (Rmax).

3. The process for producing a quartz glass tool for silicon wafer heat treatment according to claim 1, further comprising etching said grooved surface with a 5% hydrogen fluoride aqueous solution.

4. The process for producing a quartz glass tool for silicon wafer heat treatment according to claim 3, wherein rates of change in the center-line average roughness (Ra) and the maximum roughness (Rmax) after said etching with a 5% hydrogen fluoride aqueous solution carried out for 24 hours are 50% or less.

5. The process for producing a quartz glass tool for silicon wafer heat treatment according to claim 1, wherein said roughly grinding creates grooves having a width of 3 to 5 mm, a pitch of 3 to 6 mm and a groove depth of 4.5 to 10 mm.

6. The process for producing a quartz glass tool for silicon wafer heat treatment according to claim 1, wherein said roughly grinding includes use of at least one of a metal-bond-type diamond blade, a resin-bond-type diamond blade or a vitrified-bond-type diamond blade.

7. The process for producing a quartz glass tool for silicon wafer heat treatment according to claim 1, wherein said roughly grinding includes use of a blade obtained by pulverizing metal-bonded diamond to form pulverized diamond and sintering the pulverized diamond with a resin bond.

* * * * *